(12) United States Patent
Lessard

(10) Patent No.: US 6,852,924 B2
(45) Date of Patent: Feb. 8, 2005

(54) EMI SEALED REMOVABLE LATCHING COVER

(75) Inventor: John Lessard, Wichita, KS (US)

(73) Assignee: LSI Logic Corporation, Milpitas, CA (US)

( * ) Notice: Subject to any disclaimer, the term of this patent is extended or adjusted under 35 U.S.C. 154(b) by 240 days.

(21) Appl. No.: 10/210,574

(22) Filed: Jul. 30, 2002

(65) Prior Publication Data
US 2004/0020672 A1 Feb. 5, 2004

(51) Int. Cl.[7] .................................................. H02G 3/08
(52) U.S. Cl. ......................... 174/50; 174/58; 174/35 R; 220/4.02
(58) Field of Search ............................ 174/50, 35 GC, 174/35 MS, 35 R, 58, 66; 220/4.02, 3.8, 241; 361/816, 692, 693

(56) References Cited

U.S. PATENT DOCUMENTS

| 5,335,147 A | * | 8/1994 | Weber ..................... 361/818 |
| 6,107,567 A | * | 8/2000 | Blalock ...................... 174/58 |
| 6,362,417 B2 | * | 3/2002 | Mitchell et al. ........ 174/35 GC |

* cited by examiner

Primary Examiner—Dhiru R Patel
(74) Attorney, Agent, or Firm—Cochran Freund & Young LLC

(57) ABSTRACT

Disclosed is an apparatus and method for sealing a removable EMI shielded enclosure. A continuous gasket is placed between a stationary portion of the enclosure and a capture frame. The capture frame contains a second gasket that seals against a removable cover and further contains provisions for latching the removable cover to the enclosure. The latching mechanism is contained outside of the EMI shielded portion of the enclosure and can be very low profile while exerting a large compressive force.

10 Claims, 3 Drawing Sheets

EMI SEALED REMOVABLE LATCHING COVER

BACKGROUND OF THE INVENTION a. Field of the Invention

The present invention pertains generally to EMI shields and specifically EMI shields used with replaceable, latched enclosures.

b. Description of the Background

Electromagnetic Interference (EMI) shielding is an important issue for today's high speed computing devices. High speed computing devices can emit high frequency radiation that may interfere with other computing devices as well as television, radio, and other transmissions. In addition, high frequency radiation may interfere with circuitry in a device.

As digital devices become faster, the frequencies that are emitted become higher. As the frequencies increase, the wavelength decreases and shielding becomes more and more difficult. The difficulty arises because shorter wavelengths can leak from smaller openings.

The designer of EMI shielded devices must provide as much sealing as possible to a device in order to prevent unwanted radiation emissions. However, the designer must consider the serviceability of the device, the cost of manufacture, ease of manufacture, and a host of other factors. In general, the designer must place a large amount of equipment into a small enclosure and balance all of the various factors.

It would therefore be advantageous to provide a system and method for sealing an EMI shield that is low profile, easy to manufacture, serviceable, and maximizes the EMI performance.

SUMMARY OF THE INVENTION

The present invention overcomes the disadvantages and limitations of the prior art by providing a system and method of sealing an enclosure with a low profile and with a minimum of potential leak paths for EMI radiation. The invention further includes provisions for latching and securing a removable portion of an enclosure within a small space.

The present invention may therefore comprise a shielded enclosure with removable portion comprising: a stationary portion of the enclosure having an open end, the open end having a substantially planar surface comprising a continuous perimeter with provisions for receiving a plurality of fasteners about the perimeter; a first gasket disposed against the planar surface, the first gasket being at least partially electrically conductive; a receiver frame having a perimeter substantially the same size as the stationary portion and having an inner surface disposed against the first gasket, the receiver frame being connected to the stationary portion with a plurality of fasteners, the receiver frame further having a flange about the perimeter, the flange extending opposite the first gasket and comprising a portion of a holding mechanism; a second gasket disposed against the receiver frame and covering at least a portion of said fasteners, said second gasket being at least partially electrically conductive and said second gasket being further disposed inside of said flange; and a removable portion of said enclosure disposed inside of said flange of said receiver frame and having a planar surface disposed against said second gasket and further comprising a portion of said holding mechanism, said holding mechanism being adapted such that at least a portion of the holding mechanism is between the removable portion of the enclosure and the flange of the receiver frame.

The present invention may further comprise a method of constructing a shielded enclosure comprising: presenting a stationary portion of the enclosure having an open end, the open end having a substantially planar surface comprising a continuous perimeter with provisions for receiving a plurality of fasteners within the perimeter; placing a first gasket disposed against the planar surface, the first gasket being at least partially electrically conductive; connecting a receiver frame to the stationary portion with a plurality of fasteners, the receiver frame having a perimeter substantially the same size as the stationary portion and having an inner surface disposed against the first gasket, the receiver frame further having a flange about the perimeter, the flange extending opposite the first gasket and comprising a portion of a holding mechanism; placing a second gasket disposed against the receiver frame and covering at least a portion of the fasteners, the second gasket being at least partially electrically conductive and further disposed inside of the flange; and removably attaching a removable portion of the enclosure to the receiver frame with the holding mechanism, the removable portion having a planar surface disposed against the second gasket and further comprising a portion of the holding mechanism, the holding mechanism being adapted such that at least a portion of the holding mechanism is between the removable portion of the enclosure and the flange of the receiver frame.

The advantages of the present invention are that a removable EMI seal may be created that is highly impervious to EMI radiation yet contains a containment mechanism located in a small space.

DETAILED DESCRIPTION OF THE INVENTION

Figure 1:
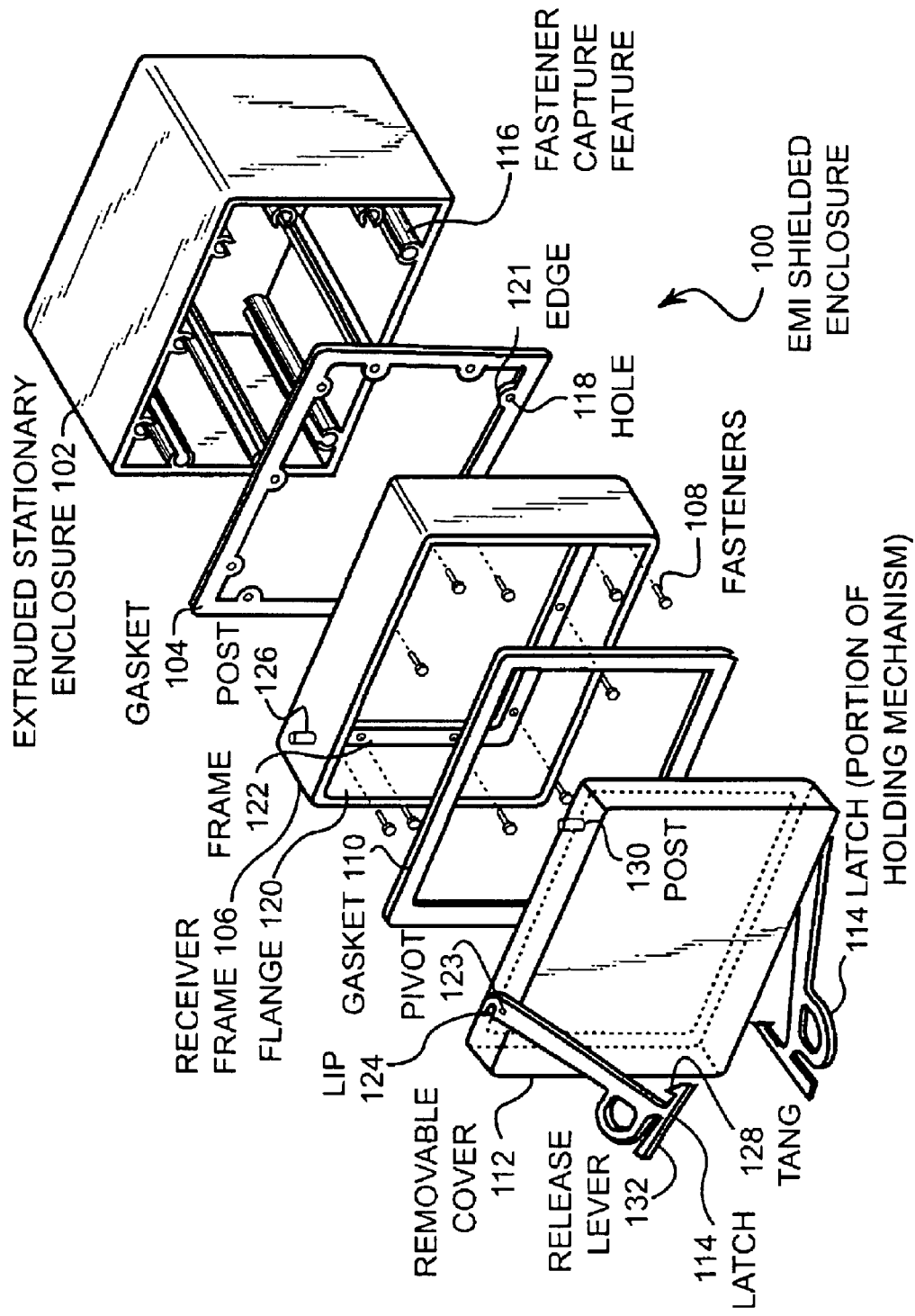
FIG. 1 illustrates an exploded view of an embodiment of the present invention of an EMI shielded enclosure.

FIG. 1 is an exploded view of an embodiment 100 of the present invention of an EMI shielded enclosure. An extruded stationary portion 102 of the enclosure has a gasket 104 between a receiver frame 106 mounted to the extrusion 102 by fasteners 108. Over the fasteners 108 lies a second gasket 110 that seals the receiver frame 106 to the removable cover 112. The cover 112 is held to the receiver frame 106 by a latch 114.

The embodiment 100 is an EMI shielded enclosure for use in electrical devices. Such devices are any device that emits high frequency radiation or any device that may be susceptible to external radiation. Many devices have EMI restrictions to comply with various federal and other requirements. In many applications, shielding for frequencies over 1 GHz must be incorporated into enclosures.

The basics of EMI shielding are well understood. In general, an enclosure should have an electrically conductive surface and have no gaps or holes. An ideal enclosure would be a metal box that has welded sides. In reality, provisions for opening and closing an enclosure must still be provided, and thus the removable cover 112 must be removably attached to the stationary portion 102 of the enclosure. The gaskets 104 and 110 may be both compliant and electrically conductive so that at least some electrical conductivity is present from one piece of the enclosure to a second. The compliance of the gasket is important so that contact between the mating parts is maximized. Any openings or gaps will be a leak path for EMI radiation. In addition, the lack of conductivity of the gaskets will add to the leakage of EMI radiation.

The extruded portion 102 contains several features 116 for capturing the fasteners 108. Card guides, heat sinks, and other features may be incorporated into the extrusion 102 as needed. Extrusion is a low cost manufacturing method with a low tooling cost and quick turn around. Common materials for extrusions are aluminum and plastic. In the case of aluminum, the extrusion may be coated with an electrically conductive plating to avoid oxidation. In the case of plastics, a metalized coating must be applied to the extrusion to achieve EMI shielding. In either case, a tubular extrusion has no seams along the sides of the extrusion, meaning that there are no leak paths for EMI radiation. Further, the extrusion can simply and easily provide four walls of a sealed box with a minimum of fabrication time.

The fastener capture feature 116 may be of several forms known in the arts to capture fasteners. In some cases, the fasteners 108 may be self-tapping screws or in other cases, a machining operation may be used to tap the features 116 to receive the fasteners 108. Other methods can be used to receive fasteners, including adding separate bracketry to the extrusion to receive fasteners. Such methods may add assembly costs to a product than if the fastener capture features were incorporated directly into the extrusion.

The receiver frame 106 seals to the extrusion 102 with the gasket 104. The manufacturing method of the extrusion 102 may involve either sawing or machining the end of the extrusion facing the receiver frame 106. Sawing is a faster, lower cost, and less accurate manufacturing process than machining. However, if the gasket 104 were compliant enough, an effective seal may be achieved with a sawn edge. In general, a machined face may be necessary to effect a very tight EMI seal. The gasket 104 is intended for substantially permanent installation into the enclosure whereas gasket 110 is intended for multiple insertions and removal of the removable cover 112.

The gasket 104 may have holes around the fastener locations or other features to help locate the gasket 104 into the assembly. The holes, such as hole 118 in the present embodiment, do not provide any sealing on the inside edge 121 since the fastener capture feature 116 does not provide any material on the extrusion in the area of edge 121 during assembly. However, the hole 118 provides a mechanism wherein the gasket 104 may be captured during the assembly process. In addition, the gasket 104 may extrude, slide, or otherwise be displaced while the fasteners 108 are tightened. In some embodiments, the gasket 104 may be a formed gasket with formed features adapted to hold the gasket 104 in place during assembly and service. In other embodiments, the gasket 104 may be fabricated by stamping or die cutting a shape from a sheet stock of gasket material. In other cases, the gasket 104 may be a paste or liquid material that cures or stabilizes during assembly.

The receiver frame 106 may be a welded sheet metal construction. The receiver frame 106 has a flange 120 and a frame 122. The frame 122 provides a surface through which the fasteners 108 may attach the receiver frame 106 to the extrusion 102. The flange 120 has the approximate outside shape as that of the extrusion 102 and provides features for a latch mechanism as well as a decorative or aesthetic cover for receiving the removable cover 112. Other methods of manufacturing the receiver frame 106 may be various forms of casting, machining the receiver frame 106 from billet, or other methods of manufacture as may be contemplated by those skilled in the arts.

The gasket 110 provides a seal between the receiver frame 106 and the removable cover 112. As such, the gasket 110 must be compliant enough to absorb the various inconsistencies and irregularities between the receiver frame 106 and the removable cover 112. Such inconsistencies may be due to warpage, burrs, nicks, or other out-of-flatness conditions of either the removable cover 112 or the receiver frame 106. In addition, the forces exerted by a hold down mechanism may impart some twisting or other non-symmetric loading to the various components.

The gasket 110 fits into the receiver frame 106 and covers the fasteners 108 in the present embodiment. In other embodiments, the gasket 110 may not cover the fasteners, or may cover some fasteners and not others, depending on the particular geometry of the latching mechanisms or other considerations.

Many different gasket materials are available to the designer of EMI enclosures. For example, beryllium copper spring finger gaskets, metal impregnated rubber gaskets, metal covered rubber gaskets, braided metal gaskets, graphite-nickel impregnated gaskets, and many other materials and material combinations are commercially available for application to EMI enclosures. Any conductive gasket material may be suited to the present invention.

The removable cover 112 has a mechanism for retaining the removable cover 112 to the receiver frame 106. One embodiment of such a mechanism is the latch 114. The latch 114 operates by rotating about a pivot 123. When fully inserted into the receiver frame 106, the lip 124 of the latch 114 may be operated to catch the post 126 of the receiver frame 106 and draw the removable cover 112 against the gasket 110. When the latch is fully engaged, the tang 128 will engage the post 130 and lock in place. To release the lock, the release lever 132 may be actuated to release the latch 114 from the post 130 and the latch 114 may be opened to disengage the lip 124 from the post 126. A second latch 114 is shown on the bottom of the removable cover 112. In the present embodiment. a first portion of the latch mechanism comprises the post 126 and a second portion of the latch mechanism comprises the latch 114, post 130, and pivot 123.

Many mechanisms for capturing a removable cover 112 to a receiver frame 106 may be envisioned by those skilled in the arts while keeping within the scope and intent of the present invention. For example, a removable cover 112 may be captured with fasteners or other mechanisms whereby a special tool is required to remove the removable cover 112. In other cases, a plurality of latching mechanisms may be used on different sides of the removable cover 112 to evenly distribute the load of the removable cover 112 against the gasket 110. In still other cases, only one latch may be necessary to fully capture and seal the removable cover 112 to the receiver frame 106. As those skilled in the arts may appreciate, the length of the latch arm may be adjusted to meet any clamping or insertion forces as desired.

The fasteners 108 may be of many varieties. For example, in the present embodiment, the fasteners 108 may be flat head screws. In other embodiments, screws with different heads may be used. Self tapping screws or non-self tapping screws may be chosen based on the loading and other requirements of the assembly. Further, the fasteners may be rivets, including blind rivets, or any other fasteners as may be envisioned.

Figure 2:
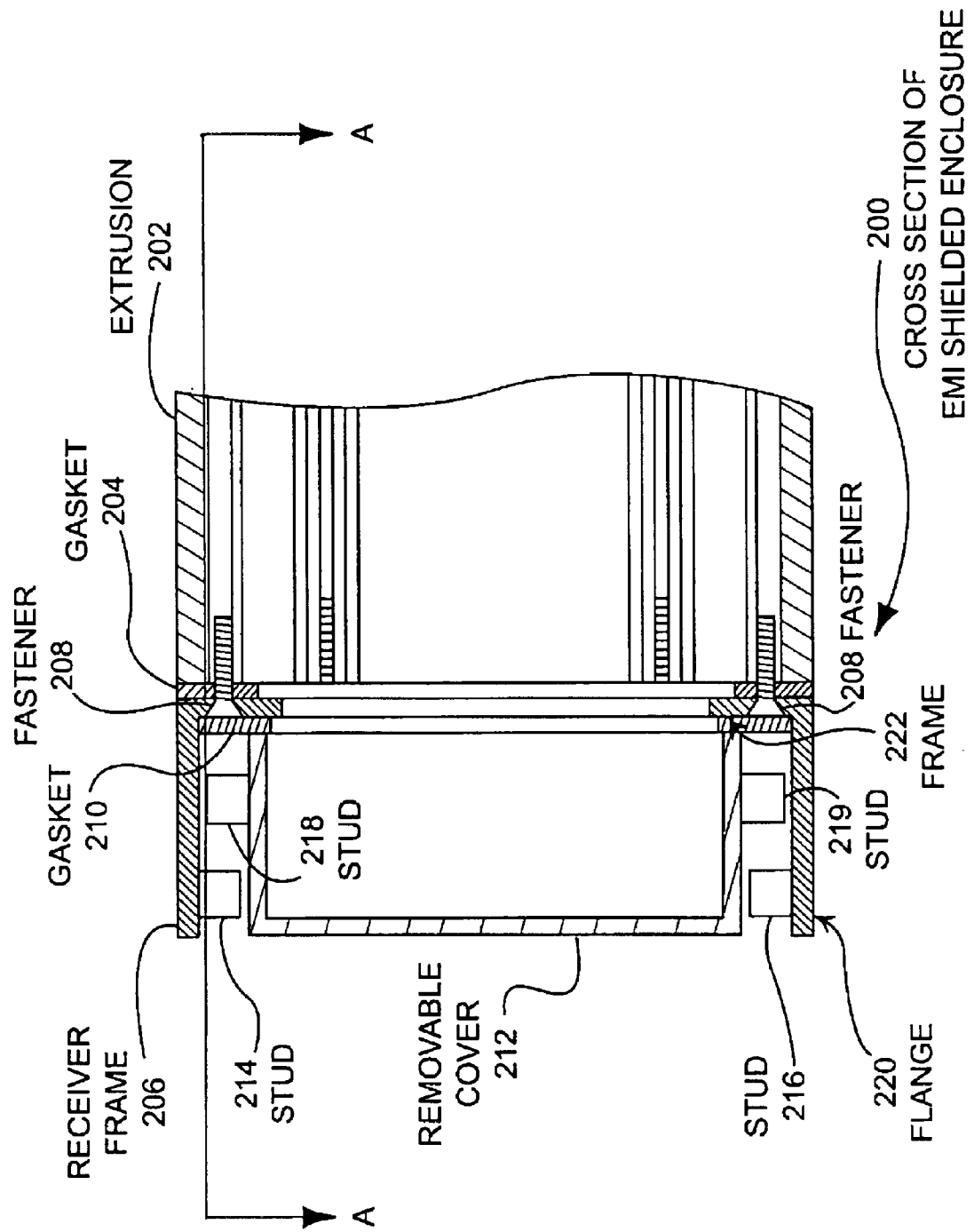
FIG. 2 illustrates a side view cross section of the assembled embodiment of the present invention of FIG. 1.

FIG. 2 is a side view cross section 200 of the assembled embodiment of the present invention of FIG. 1. The extrusion 202, gasket 204, and receiver frame 206 are assembled with fasteners 208. The gasket 210 seals the removable cover 212 to the frame 222 of receiver frame 206. The latch of FIG. 1 is not shown in the present figure. The studs 214 and 216 are mounted on the receiver frame 206 and the studs 218 and 219 are mounted on the removable cover 212. In the present embodiment, two latching mechanisms are located on the top and bottom of the removable cover 212.

The removable cover 212 extends approximately the same distance as flange 220 in the present embodiment. The flange 220 serves as a support for the studs 214 and 216 that are part of the latching mechanism as well as an aesthetic element of the look of the assembled enclosure. In some cases, the flange 220 may extend further and the removable cover 212 such that the removable cover 212 is recessed within the flange 220. In other cases, the removable cover 212 may protrude outside of the flange 220. In still other cases, a portion of the flange 220 may be recessed and a portion extended. The shape of the flange 220 may be many shapes as may be envisioned by those skilled in the arts while maintaining within the scope and intent of the present invention.

The flange 220 and the surface 222 provide many options for the enclosure designer to incorporate very low profile latching mechanisms to seal the enclosure. The gap between the surface 222 and the flange 220 allows a rotating latch mechanism with a relatively large lever arm to be placed outside of the EMI enclosure without penetrating the EMI shield. Every penetration of the EMI enclosure offers a potential leak path for EMI radiation. By keeping the latching mechanism outside of the EMI shielded environment, the EMI shielding can be improved.

Figure 3:
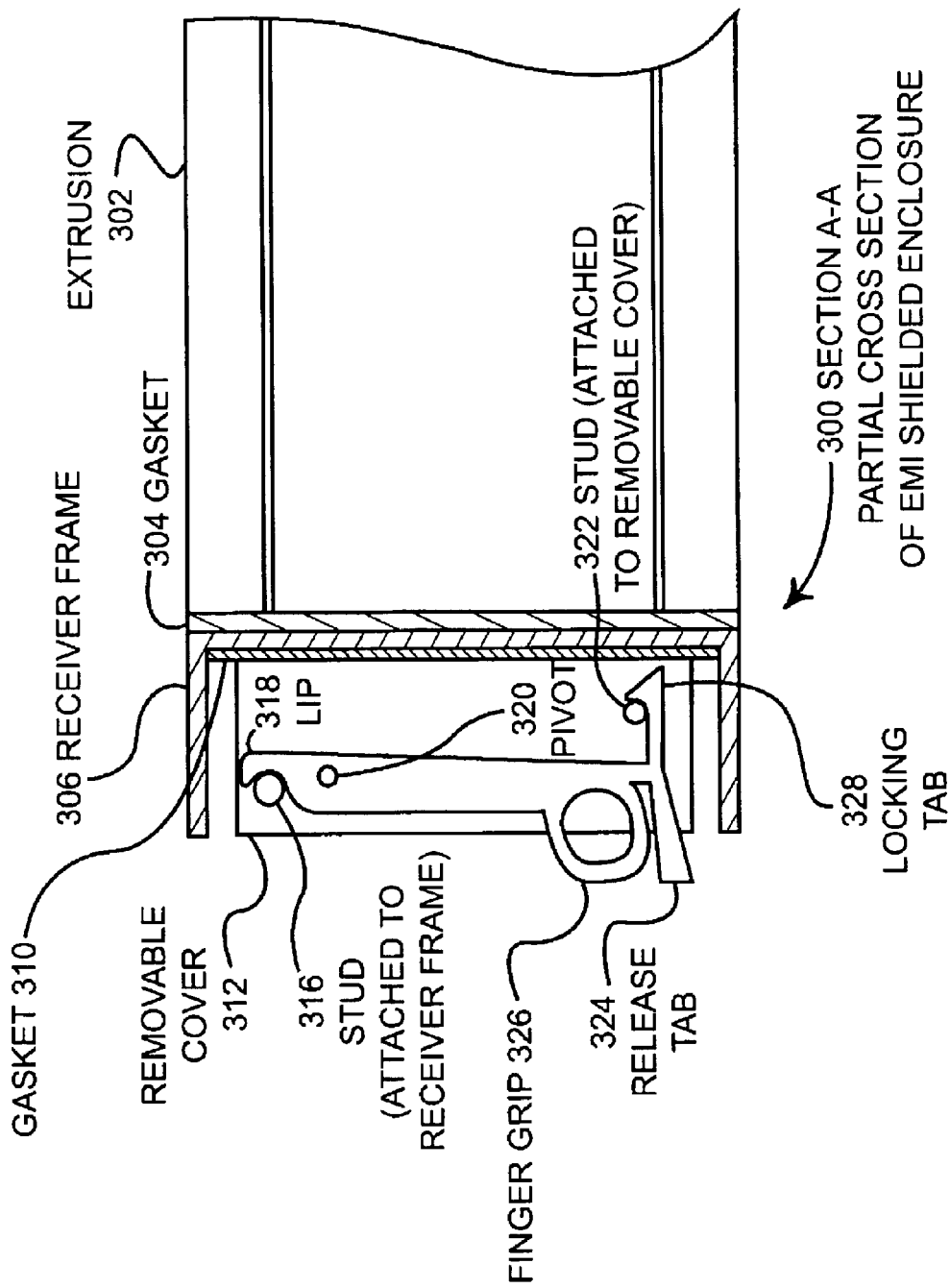
FIG. 3 illustrates cross section of FIG. 2 of an embodiment of the present invention, showing the latch mechanism fully engaged.

FIG. 3 illustrates cross section A—A of FIG. 2 of an embodiment of the present invention 300, showing the latch mechanism fully engaged. The extrusion 302, gasket 304, receiver frame 306 and second gasket 310 are shown. The removable cover 312 is shown with the latch 314. The stud 316 is attached to the receiver frame 306 and is captured by the lip 318 of the latch 314. The latch 314 pivots about the pivot 320 and snaps in place against stud 322.

The latch 314 may be released by pressing the release tab 324 towards the finger grip 326, disengaging the locking tab 328 from the stud 322 and allowing an operator to swing the latch 314 in a clockwise direction.

The removable cover 312 may have electrical or mechanical devices attached to the cover that engage another device, such as a backplane or other connector, when the cover 312 and its attached contents are inserted and latched into place. For example, the cover 312 may have electronic devices mounted onto the cover 312 such as a hard drive or printed circuit boards. Bracketry and a connector scheme may also be attached to the cover 312 whereupon insertion and latching into the extrusion, the connectors and bracketry engage mating devices mounted in the extrusion. The removable cover 312 may further be a customer replaceable unit that is intended for quick service by a technician.

The latch 314 has a large moment arm for effectively squeezing the removable cover 312 against the gasket 310. In some cases, the gasket 310 may require a large amount of compressive force to effectively seal the removable cover 312. Thus, the large moment arm provided by the present embodiment may make such compressive forces manageable by a hand-operated lever. The length of the latch arm can be adjusted as needed to accomplish the required mechanical insertion and mating forces. Many latching mechanisms may be envisioned by those skilled in the arts whereby the removable cover 312 may be removably attached to the receiver frame 306.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A shielded enclosure with removable portion comprising:

a stationary portion of said enclosure having an open end, said open end having a substantially planar surface comprising a continuous first perimeter with provisions for receiving a plurality of fasteners about said first perimeter;

a first gasket disposed against said planar surface, said first gasket being at least partially electrically conductive;

a receiver frame having a second perimeter substantially the same size as said stationary portion and having an inner surface disposed against said first gasket, said receiver frame being connected to said stationary portion with a plurality of fasteners, said receiver frame further having a flange about said second perimeter, said flange extending opposite said first gasket and comprising a first portion of a holding mechanism;

a second gasket disposed against said receiver frame and covering at least a portion of said fasteners, said second gasket being at least partially electrically conductive and said second gasket being further disposed inside of said flange; and a removable cover of said enclosure disposed inside of said flange of said receiver frame and having a planar surface disposed against said second gasket and further comprising a second portion cover of said holding mechanism, said holding mechanism being adapted such that at least a portion of said second portion of said holding mechanism is between said removable of said enclosure and said flange of said receiver frame.

2. The enclosure of claim 1 wherein said stationary portion of said enclosure is an extrusion.

3. The enclosure of claim 2 wherein said extrusion incorporates at least one feature for capturing at least one of said fasteners.

4. The enclosure of claim 1 wherein said first gasket comprises a feature for capturing said first gasket into said enclosure.

5. The enclosure of claim 1 wherein said holding mechanism comprises a lever, said lever adapted to engage a feature on said receiver frame and further adapted to compress said removable portion against said second gasket.

6. A method of constructing a shielded enclosure comprising:

presenting a stationary portion of said enclosure having an open end, said open end having a substantially planar surface comprising a continuous first perimeter with provisions for receiving a plurality of fasteners within said first perimeter;

placing a first gasket disposed against said planar surface, said first gasket being at least partially electrically conductive;

connecting a receiver frame to said stationary portion with a plurality of fasteners, said receiver frame having a second perimeter substantially the same size as said stationary portion and having an inner surface disposed against said first gasket, said receiver frame further having a flange about said second perimeter, said flange extending opposite said first gasket and comprising a portion of a holding mechanism;

placing a second gasket disposed against said receiver frame and covering at least a portion of said fasteners, said second gasket being at least partially electrically conductive and further disposed inside of said flange; and removably attaching a removable cover of said enclosure to said receiver frame with said holding mechanism, said removable cover having a planar surface disposed against said second gasket and further comprising a second portion of said holding mechanism, said holding mechanism being adapted such that at least a portion of said second portion of said holding mechanism is between said removable portion of said enclosure and said flange of said receiver frame.

7. The method of claim 6 wherein said stationary portion of said enclosure is an extrusion.

8. The method of claim 7 wherein said extrusion incorporates at least one feature for capturing at least one of said fasteners.

9. The method of claim 6 wherein said first gasket comprises a feature for capturing said first gasket into said enclosure.

10. The method of claim 6 wherein said holding mechanism comprises a lever, said lever adapted to engage a feature on said receiver frame and further adapted to compress said removable portion against said second gasket.

* * * * *